US012772732B2

(12) United States Patent
Kilchyk et al.

(10) Patent No.: US 12,772,732 B2
(45) Date of Patent: Oct. 20, 2026

(54) ACTUATOR FORMED OF THERMALLY ADAPTIVE MATERIAL AND A THERMOELECTRIC JUNCTION

(71) Applicant: Hamilton Sundstrand Corporation, Charlotte, NC (US)

(72) Inventors: Viktor Kilchyk, Lancaster, NY (US); Brent J. Merritt, Southwick, MA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 85 days.

(21) Appl. No.: 18/464,163

(22) Filed: Sep. 8, 2023

(65) Prior Publication Data

US 2025/0089568 A1 Mar. 13, 2025

(51) Int. Cl.
*H10N 10/13* (2023.01)
*H10N 10/17* (2023.01)
(Continued)

(52) U.S. Cl.
CPC ............ *H10N 10/13* (2023.02); *H10N 10/17* (2023.02); *H10N 10/80* (2023.02); *H10N 10/81* (2023.02); *H10N 10/817* (2023.02)

(58) Field of Classification Search
CPC ........ H10N 10/17; H10N 10/80; H10N 10/81; H10N 10/13
See application file for complete search history.

(56) References Cited

U.S. PATENT DOCUMENTS 3,326,726 A 6/1967 Bassett, Jr. et al.
3,513,881 A 5/1970 Kinsell
(Continued)

FOREIGN PATENT DOCUMENTS

CN 114423927 A 4/2022
DE 10250758 A1 5/2004
(Continued)

OTHER PUBLICATIONS

Doering et al., "Micromachined thermoelectrically driven cantilever structures for fluid jet deflection" [1992] Proceedings IEEE Micro Electro Mechanical Systems. IEEE, (Feb. 1992) pp. 12-18.
(Continued)

*Primary Examiner* — Lindsey A Buck
(74) *Attorney, Agent, or Firm* — CANTOR COLBURN LLP

(57) ABSTRACT

An actuator, having: an actuator body extending between an actuator top and an actuator bottom, a top actuator support located at the actuator top and a bottom actuator support located at the actuator bottom, wherein the actuator body includes: a wall defining an outer boundary and extending longitudinally from a first end to a second end and transversely from a first side to a second side, wherein: the wall is nonmetal; the wall defines: a first segment extending longitudinally between the first and second ends and transversely from the first side to a segment junction; and a second segment extending longitudinally between the first and second ends and transversely from the second side to the segment junction; and the first segment has a first coefficient of thermal expansion (CTE) and the second segment has a second CTE that differs from the first CTE, to define a transverse CTE gradient.

15 Claims, 11 Drawing Sheets

(51) Int. Cl.

| | |
|---|---|
| ***H10N 10/80*** | (2023.01) |
| ***H10N 10/81*** | (2023.01) |
| ***H10N 10/817*** | (2023.01) |

(56) References Cited

U.S. PATENT DOCUMENTS

| | | | |
|---|---|---|---|
| 3,687,365 | A | 8/1972 | Laessig |
| 4,327,154 | A | 4/1982 | Rossmann |
| 4,418,549 | A | 12/1983 | Courneya |
| 4,441,653 | A | 4/1984 | Grudich |
| 4,454,983 | A | 6/1984 | Tarvis, Jr. |
| 4,851,285 | A | 7/1989 | Brotz |
| 4,939,038 | A | 7/1990 | Inabata |
| 5,230,850 | A | 7/1993 | Lewis |
| 5,634,189 | A | 5/1997 | Rossmann et al. |
| 5,720,339 | A | 2/1998 | Glass et al. |
| 5,769,389 | A | 6/1998 | Jacobsen et al. |
| 6,100,463 | A | 8/2000 | Ladd et al. |
| 6,161,382 | A | 12/2000 | Brotz |
| 6,182,929 | B1 | 2/2001 | Martin et al. |
| 6,371,437 | B1 | 4/2002 | Kenny et al. |
| 7,037,076 | B2 | 5/2006 | Jacot et al. |
| 7,147,269 | B2 | 12/2006 | Aase et al. |
| 7,650,910 | B2 | 1/2010 | Welle |
| 7,686,040 | B2 | 3/2010 | Welle |
| 7,721,762 | B2 | 5/2010 | Welle |
| 7,753,654 | B2 | 7/2010 | Read et al. |
| 7,770,959 | B2 | 8/2010 | Browne et al. |
| 7,854,467 | B2 | 12/2010 | McKnight et al. |
| 7,922,456 | B2 | 4/2011 | McMillan |
| 7,967,568 | B2 | 6/2011 | Dalton et al. |
| 8,119,206 | B2 | 2/2012 | Hougham et al. |
| 8,205,668 | B2 | 6/2012 | Freese |
| 9,181,933 | B2 | 11/2015 | Daly et al. |
| 9,719,536 | B2 | 8/2017 | Ashmawi et al. |
| 9,752,442 | B2 | 9/2017 | Hayford et al. |
| 9,784,126 | B2 | 10/2017 | Army et al. |
| 9,897,078 | B2 | 2/2018 | Nicholson et al. |
| 9,919,470 | B2 | 3/2018 | Behl et al. |
| 9,981,421 | B2 | 5/2018 | Marcoe et al. |
| 10,053,239 | B2 | 8/2018 | Mabe et al. |
| 10,543,897 | B2 | 1/2020 | Brown et al. |
| 10,731,666 | B2 | 8/2020 | Skertic |
| 10,815,976 | B2 | 10/2020 | Kaneko et al. |
| 10,976,119 | B2 | 4/2021 | Veto et al. |
| 10,982,783 | B2 | 4/2021 | Srinivasa Murthy |
| 11,008,943 | B2 | 5/2021 | Tajiri et al. |
| 11,110,647 | B2 | 9/2021 | Marcoe et al. |
| 11,167,836 | B2 | 11/2021 | Hethcock, Jr. |
| 11,192,333 | B2 | 12/2021 | Hahnlen |
| 11,248,592 | B1 | 2/2022 | Tsuruta et al. |
| 11,268,520 | B2 | 3/2022 | Melo et al. |
| 11,359,287 | B2 | 6/2022 | Philibert |
| 11,655,346 | B2 | 5/2023 | Jackson et al. |
| 11,668,316 | B1 | 6/2023 | Kilchyk et al. |
| 12,162,606 | B1 | 12/2024 | Merritt et al. |
| 12,384,515 | B2 | 8/2025 | Kilchyk et al. |
| 2001/0008357 | A1 | 7/2001 | Dhuler et al. |
| 2003/0025093 | A1 | 2/2003 | Kenny et al. |
| 2005/0005983 | A1 | 1/2005 | Lewis |
| 2007/0140862 | A1 | 6/2007 | McMillan |
| 2007/0171257 | A1 | 7/2007 | Yang |
| 2007/0184238 | A1 | 8/2007 | Hockaday et al. |
| 2008/0196430 | A1 | 8/2008 | McGill et al. |
| 2008/0236668 | A1 | 10/2008 | Beerling et al. |
| 2008/0302024 | A1 | 12/2008 | Browne et al. |
| 2010/0028205 | A1 | 2/2010 | Ponjee et al. |
| 2010/0304063 | A1 | 12/2010 | Mccrea et al. |
| 2011/0284645 | A1 | 11/2011 | Tiliakos et al. |
| 2012/0255278 | A1 | 10/2012 | Miao et al. |
| 2013/0048135 | A1 | 2/2013 | Blumenthal et al. |
| 2013/0255796 | A1 | 10/2013 | Dimascio et al. |
| 2013/0255815 | A1 | 10/2013 | Brinkmann et al. |
| 2013/0287555 | A1 | 10/2013 | Rosen et al. |
| 2014/0186161 | A1 | 7/2014 | Colson et al. |
| 2015/0033730 | A1 | 2/2015 | Beers et al. |
| 2015/0239046 | A1 | 8/2015 | Mcmahan et al. |
| 2016/0025078 | A1 | 1/2016 | Li et al. |
| 2016/0160353 | A1 | 6/2016 | Miarecki et al. |
| 2016/0160869 | A1 | 6/2016 | Roach et al. |
| 2016/0186575 | A1 | 6/2016 | Lacy et al. |
| 2017/0001263 | A1 | 1/2017 | Steiner |
| 2017/0227019 | A1 | 8/2017 | Chen et al. |
| 2018/0038513 | A1 | 2/2018 | Baldea et al. |
| 2018/0043660 | A1 | 2/2018 | Kang et al. |
| 2018/0058429 | A1* | 3/2018 | Kwon .................. H10N 19/101 |
| 2019/0203039 | A1 | 7/2019 | Seo et al. |
| 2019/0210111 | A1 | 7/2019 | Army et al. |
| 2020/0009826 | A1 | 1/2020 | Brown et al. |
| 2020/0316684 | A1 | 10/2020 | Shuck |
| 2021/0020263 | A1 | 1/2021 | Pasini et al. |
| 2021/0071020 | A1 | 3/2021 | Hu |
| 2021/0085856 | A1 | 3/2021 | Ding |
| 2021/0229350 | A1 | 7/2021 | Chaffins et al. |
| 2021/0238748 | A1 | 8/2021 | Andreatta |
| 2021/0277937 | A1 | 9/2021 | Elbibary et al. |
| 2021/0372286 | A1 | 12/2021 | Chakrabarti et al. |
| 2022/0034592 | A1 | 2/2022 | Maynard et al. |
| 2022/0089799 | A1 | 3/2022 | Wang et al. |
| 2023/0080512 | A1 | 3/2023 | Merritt et al. |
| 2023/0085189 | A1 | 3/2023 | Merritt et al. |
| 2023/0142146 | A1 | 5/2023 | Kilchyk |
| 2023/0227680 | A1 | 7/2023 | Hu |
| 2023/0304506 | A1 | 9/2023 | Kilchyk et al. |
| 2025/0033270 | A1 | 1/2025 | Merritt et al. |
| 2025/0033271 | A1 | 1/2025 | Merritt et al. |
| 2025/0033272 | A1 | 1/2025 | Merritt et al. |
| 2025/0033282 | A1 | 1/2025 | Merritt et al. |
| 2025/0033283 | A1 | 1/2025 | Merritt et al. |
| 2025/0033796 | A1 | 1/2025 | Merritt et al. |
| 2025/0083795 | A1 | 3/2025 | Kilchyk et al. |
| 2025/0084766 | A1 | 3/2025 | Kilchyk et al. |
| 2025/0084833 | A1 | 3/2025 | Kilchyk et al. |
| 2025/0084834 | A1 | 3/2025 | Kilchyk et al. |
| 2025/0084859 | A1 | 3/2025 | Kilchyk et al. |
| 2025/0085725 | A1 | 3/2025 | Kilchyk et al. |
| 2025/0088125 | A1 | 3/2025 | Kilchyk et al. |
| 2025/0089567 | A1 | 3/2025 | Kilchyk et al. |
| 2025/0089568 | A1 | 3/2025 | Kilchyk et al. |

FOREIGN PATENT DOCUMENTS

| | | | |
|---|---|---|---|
| DE | 102014225229 | A1 | 6/2016 |
| EP | 2025777 | A2 | 2/2009 |
| EP | 2974954 | A1 | 1/2016 |
| EP | 2960497 | B1 | 12/2016 |
| EP | 4177440 | A1 | 5/2023 |
| EP | 4209681 | A1 | 7/2023 |
| EP | 4219959 | A2 | 8/2023 |
| EP | 4411108 | A2 | 8/2024 |
| GB | 2472053 | A | 1/2011 |
| JP | 2007023361 | A | 2/2007 |
| JP | 2011148037 | A | 8/2011 |
| JP | 2022121766 | A | 8/2022 |
| KR | 20130005989 | A | 1/2013 |
| WO | 2015006438 | A1 | 1/2015 |
| WO | 2018108908 | A1 | 6/2018 |
| WO | 2019108203 | A1 | 6/2019 |
| WO | 2019162754 | A1 | 8/2019 |

OTHER PUBLICATIONS

European Search Report for Application No. 24188713.2, mailed Jan. 2, 2025, 6 pages.

European Search Report for Application No. 24190738.5, mailed Jan. 13, 2025, 8 pages.

European Search Report for Application No. 24196219.0, mailed Jan. 13, 2025, 8 pages.

European Search Report for Application No. 24196295.0, mailed Jan. 29, 2025, 16 pages.

European Search Report for Application No. 24196309.9, mailed Jan. 28, 2025, 10 pages.

(56) References Cited

OTHER PUBLICATIONS

European Search Report for Application No. 24199023.3, mailed Feb. 21, 2025, 15 pages.
European Search Report for Application No. 24199038.1, mailed Jan. 31, 2025, 8 pages.
European Search Report for Application No. 24199041.5, mailed Jan. 28, 2025, 8 pages.
Jerman "Electrically-activated, micromachined diaphragm valves" IEEE 4th Technical Digest on Solid-State Sensor and Actuator Workshop, Hilton Head, SC, USA, (Jun. 1990) pp. 65-69.
Jerman et al., "Electrically activated normally closed diaphragm valves" Journal of Micromechanics and Microengineering 4.4 (Dec. 1994) pp. 210-216.
Partial European Search Report for Application No. 24196240.6, mailed Feb. 7, 2025, 16 pages.
Richardson,, "The aerospace secret standard", Apr. 12, 2019, Aerospace Manufacturing, www.aero-mag.com/the-aerospace-secret-standard; 8 pages.
Micalizzi, Simone et al., Shape-memory actuators manufactured by dual extrusion multimaterial 3d printing of conductive and non-conductive filaments; 2019 Smart Mater. Struct. 28 105025; 13 pages.
Kim, Daejong, "Parametric Studies on Static and Dynamic Performance of Air Foil Bearings with Different Top Foil Geometries and Bump Stiffness Distributions", https://doi.org/10.1115/1.2540065; Published Online: Nov. 15, 2006, 9 pages.
Lim, Teik-Cheng "Metamaterial with sign-toggling thermal expansivity inspired by Islamic motifs in Spain", Journal of Science: Advanced Materials and Devices, vol. 7, No. 1, Mar. 2022, 6 pages.
Markforged "Onyx FR-A and Carbon Fiber FR-A: Aerospace-Ready Materials", markforged.com, Jul. 26, 2021, pp. 1-6.
Micalizz, et al., "Shape-memory actuators manufacturing by dual extrusion multimaterial 3d printing of conductive and non-conductive filaments", Smart Mater. Struct. 28, 2019, pp. 1-13.
Noughabi et al., "Detailed Design and Aerodynamic Performance Analysis of a Radial-Inflow Turbine", Applied Sciences, 2018, pp. 1-21.
Pearson et al., "Novel polyurethane elastomeric composites reinforced with alumina, aramid, and poly (p-phenylene-2, 6-benzobisoxazole) short fibers, development and characterization of the thermal and dynamic mechanical properties", Composites Part B: Engineering 122 (2017): 192-201.
Schmiedeke, et al. "Experimental Investigation of Two Switching States of an Active Foil Bearing during Start-Up", Machines 2022, Published Jun. 6, 2022, 18 pages.
Wei, et al., "An overview of laser-based multiple metallic material additive manufacturing: from macro-to micro-scales", International Journal of Extrem. Manuf. 3 (2021), pp. 1-33.
Zhan et al., "Metal-plastic hybrid 3D printing using catalyst-loaded filament and electroless plating", Additive Manufacturing, 2020, pp. 1-7.
Zhiguo et al., "Determination of thermal expansion coefficients for unidirectional fiber-reinforced composites", Chinese Journal of Aeronautics, 2014, pp. 1-14.
European Search Report for Application No. 224188681.1, mailed Dec. 4, 2024, 10 pages.
European Search Report for Application No. 24188696.9, mailed Dec. 16, 2024, 8 pages.
European Search Report for Application No. 24188714.0, mailed Dec. 13, 2024, 10 pages.
European Search Report for Application No. 24196227.3, mailed Oct. 31, 2024, 10 pages.
European Search Report for Application No. 24196233.1, mailed Oct. 31, 2024, 10 pages.
European Search Report for Application No. 24198989.6, mailed Nov. 4, 2024, 11 pages.
Extended European Search Report for EP Application No. 24182403.6, dated Jun. 2, 2025, pp. 1-11.
Extended European Search Report for EP Application No. 24196240.6, dated Apr. 28, 2025, pp. 1-13.
Giani et al., "Towards sustainability in 3D printing of thermoplastic composites: Evaluation of recycled carbon fibers as reinforcing agent for FDM filament production and 3D printing", Composites: Part A 159, 2002, pp. 1-12.
Lazarus et al., "Direct electroless plating of conductive thermoplastics for selective metallization of 3D printed parts", Additive Manufacturing, vol. 55, Mar. 30, 2022, pp. 1-11.
Tammaro et al., "Reinforcing Efficiency of Recycled Carbon Fiber PLA Filament Suitable for Additive Manufacturing", Polymers 2024, pp. 1-17.
Hao et al., "A Review of Smart Materials for the Boost of Soft Actuators, Soft Sensors, and Robotics Applications", Chinese Journal of Mechanical Engineering, 2022, pp. 1-16.

* cited by examiner (T2 > T1)

ACTUATOR FORMED OF THERMALLY ADAPTIVE MATERIAL AND A THERMOELECTRIC JUNCTION

BACKGROUND

The embodiments are directed to an actuator and more specifically to an actuator formed of thermally adaptive material and a thermoelectric junction.

Memory shape materials may be utilized for various applications to avoid the requirement of utilizing complex machinery. However, surrounding temperatures may undesirably control the shape of the material.

BRIEF DESCRIPTION

Disclosed is an actuator, including: an actuator body extending between an actuator top and an actuator bottom, a top actuator support located at the actuator top and a bottom actuator support located at the actuator bottom, wherein the actuator body includes: a wall defining an outer boundary and extending longitudinally from a first end to a second end and transversely from a first side to a second side, wherein: the wall is nonmetal; the wall defines: a first segment extending longitudinally between the first and second ends and transversely from the first side to a segment junction; and a second segment extending longitudinally between the first and second ends and transversely from the second side to the segment junction; and the first segment has a first coefficient of thermal expansion (CTE) and the second segment has a second CTE that differs from the first CTE, to define a transverse CTE gradient.

In addition to one or more of the above disclosed aspects of the actuator or as an alternate a thermoelectric junction is disposed around the outer boundary or between the first and second segments.

In addition to one or more of the above disclosed aspects of the actuator or as an alternate the second CTE is lower than the first CTE.

In addition to one or more of the above disclosed aspects of the actuator or as an alternate the first and second segments are formed of a first material having the first CTE; the first segment includes first fibers formed of a second material that differs from the first material and has the second CTE.

In addition to one or more of the above disclosed aspects of the actuator or as an alternate the second segment includes second fibers formed of a third material that differs from the first and second materials and has a third CTE that differs from the first and second CTEs.

In addition to one or more of the above disclosed aspects of the actuator or as an alternate the third CTE is greater than the second CTE.

In addition to one or more of the above disclosed aspects of the actuator or as an alternate the first segment is formed of a first material having the first CTE; the second segment is formed of a second material that differs from the first material and has the second CTE.

In addition to one or more of the above disclosed aspects of the actuator or as an alternate the first segment defines a first CTE gradient and the second segment defines a second CTE gradient such that a maximum difference between the first CTE and the second CTE is at the first and second sides and a minimum difference between the first CTE and the second CTE is at the segment junction.

In addition to one or more of the above disclosed aspects of the actuator or as an alternate at the segment junction, the first CTE and the second CTE are the same as each other.

In addition to one or more of the above disclosed aspects of the actuator or as an alternate the wall extends linearly between the first and second ends.

In addition to one or more of the above disclosed aspects of the actuator or as an alternate the wall defines one or more arcs between the first and second ends.

Further disclosed is another actuator, including: an actuator body extending between an actuator top and an actuator bottom, a top actuator support located at the top and a bottom actuator support located at the actuator bottom, wherein the actuator body includes: a base having an outer boundary extending longitudinally from a first end to a second end and transversely from a first side to a second side; and beads within the outer boundary, wherein each of the beads is nonmetal, has a bead void, and defines: first and second perimeter segments that are opposite each other and have a first CTE; and third and fourth perimeter segments that are opposite each other and adjacent to the first and second perimeter segments and have a second CTE that differs from the first CTE, to define a bead CTE gradient.

In addition to one or more of the above disclosed aspects of the another actuator or as an alternate a thermoelectric junction is disposed around the outer boundary or in one or more of the bead voids.

In addition to one or more of the above disclosed aspects of the another actuator or as an alternate each of the beads defines: an outer surface; and an inner surface, wherein the inner surface defines the bead void, wherein: the outer surface of the first and second perimeter segments has the first CTE, and the inner surface of the first and second perimeter segments has the second CTE; and the outer surface of the third and fourth perimeter segments has the second CTE, and the inner surface of the third and fourth perimeter segments has the first CTE.

In addition to one or more of the above disclosed aspects of the another actuator or as an alternate the base includes a top elastomer layer that is disposed against the first end along the outer boundary and a bottom elastomer layer that is disposed against the second end along the outer boundary.

In addition to one or more of the above disclosed aspects of the another actuator or as an alternate the base includes an elastomer segment that extends from each of the beads that are located along the outer boundary of the base, so that adjacent ones of the elastomer segments overlap each other to define a flexible outer boundary cover.

In addition to one or more of the above disclosed aspects of the another actuator or as an alternate the base is formed as a block having an outer surface that defines the outer boundary and base voids, wherein each of the voids is lined with one of the beads.

In addition to one or more of the above disclosed aspects of the another actuator or as an alternate the block is nonmetal.

In addition to one or more of the above disclosed aspects of the another actuator or as an alternate each of the beads is oval shaped or diamond shaped.

BRIEF DESCRIPTION OF THE DRAWINGS

The following descriptions should not be considered limiting in any way. With reference to the accompanying drawings, like elements are numbered alike:

FIG. 14A shows an equivalent structure with a composition gradient formed of a plurality of materials having different coefficients of thermal expansion (CTE), at a temperature T1.

DETAILED DESCRIPTION

A detailed description of one or more embodiments of the disclosed apparatus and method are presented herein by way of exemplification and not limitation with reference to the Figures.

Figure 1B:
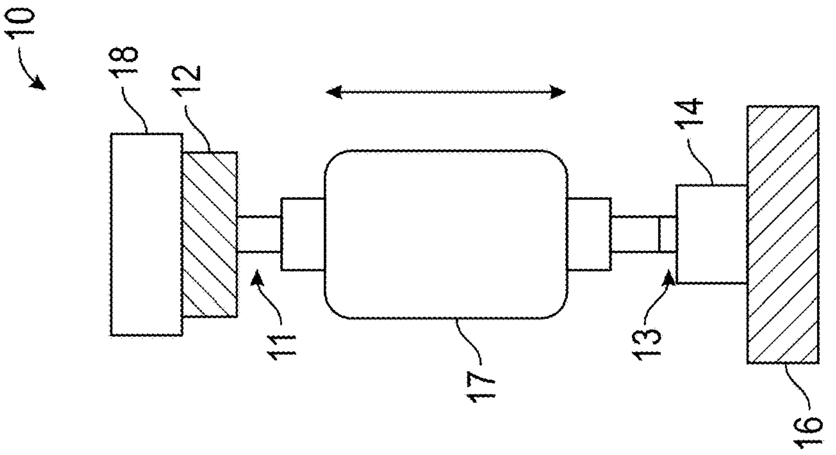
FIG. 1B shows a component according to an embodiment, where the component is an actuator that may be utilized for the aircraft.
Figure 1A:
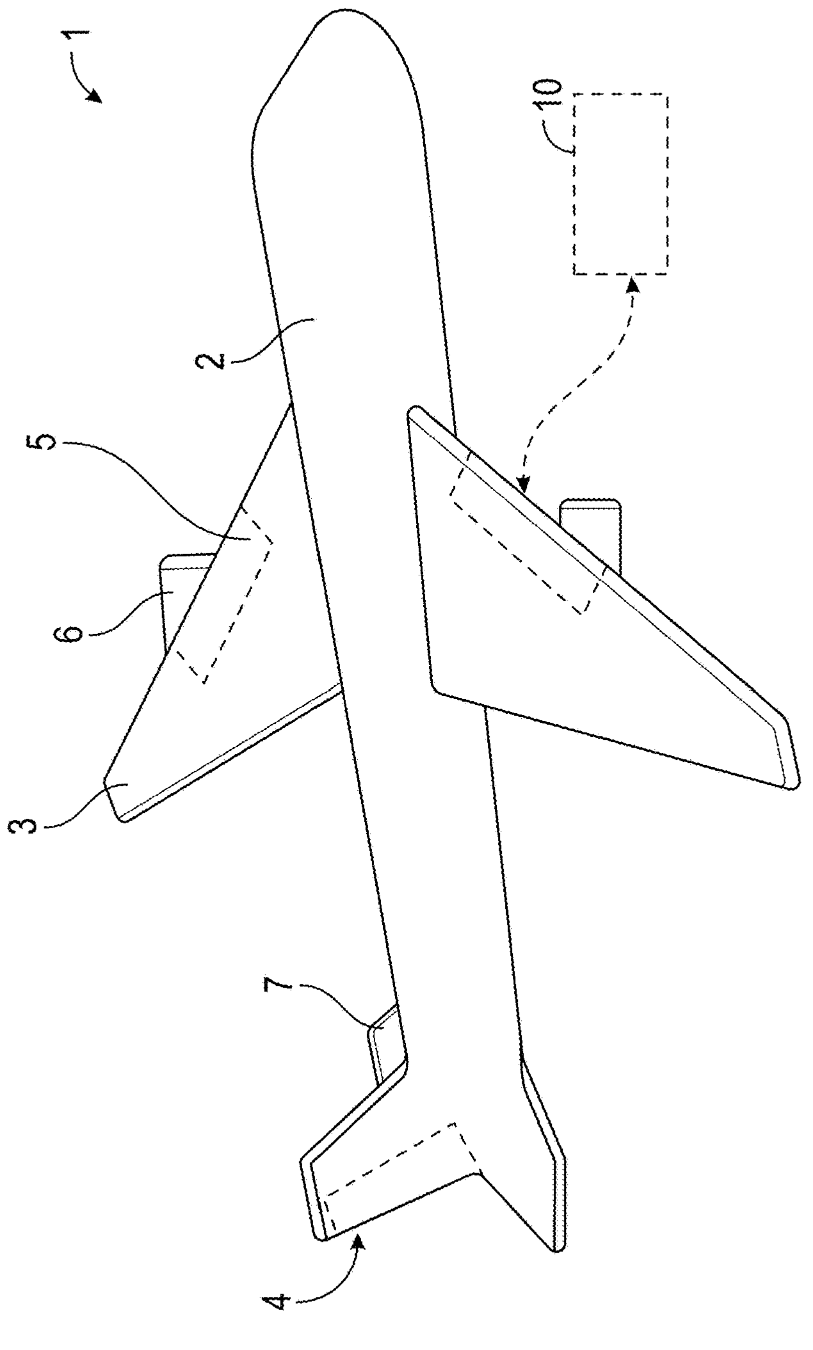
FIG. 1A shows an aircraft according to an embodiment.

FIG. 1A shows an aircraft 1 having a fuselage 2 with a wing 3 and tail assembly 4, which may have control surfaces 5. The wing 3 may include an engine 6, such as a gas turbine engine, and an auxiliary power unit 7 may be disposed at the tail assembly 4. Though an aircraft is shown, the embodiments are applicable to space and ground applications as well, and may be applicable to airfoils as well.

FIG. 1B shows a component 10 of the aircraft 1. The component 10 may be an actuator connected between a ground structure 16 and a movable component 18 such as a control surface of the aircraft 1. The actuator 10 may include an actuator body 17 extending between an actuator top 11 and an actuator bottom 13. Atop actuator support 12 may be located at the actuator top 11 and a bottom actuator support 14 may be located at the actuator bottom 13. In one embodiment, the component 10 is additively manufactured. The embodiments include actuators that have, e.g., many degrees of freedom, including movement along its length and width, etc., and twist and rotation along each axis (similar to three-dimensional deformation of a boundary of an elastic element).

Figure 2B:
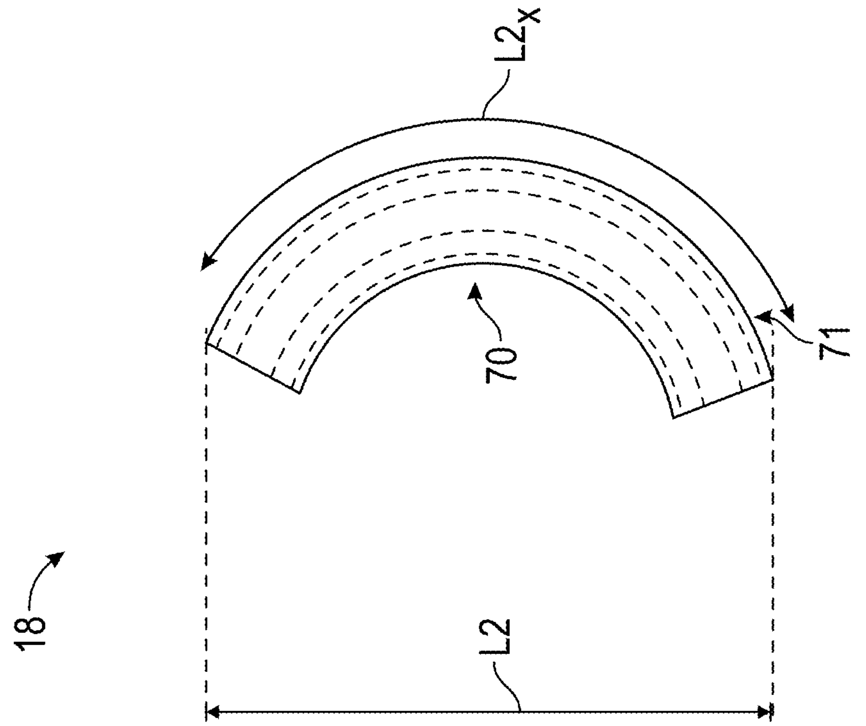
FIG. 2B shows the element of FIG. 2A in a deformed state.
Figure 2A:
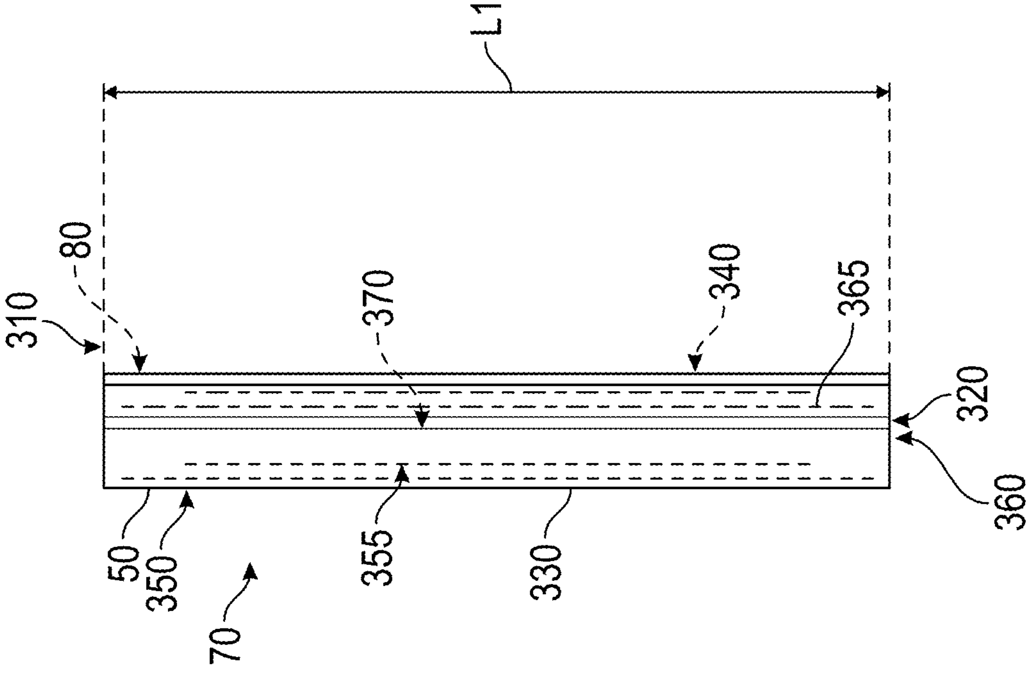
FIG. 2A shows an element that may be utilized to form the component, where the element may have segments with fibers having different coefficients of thermal expansion (CTE) selected to provide a predetermined deformation.

As shown in FIGS. 2A-2B, the actuator body 17 includes an element 70 defining a wall 50 having an outer boundary 80 and extending longitudinally from a first end 310 to a second end 320 and transversely from a first side 330 to a second side 340. The wall 50 is nonmetal and may be, e.g., a thermoplastic.

The wall 50 defines a first segment 350 extending longitudinally between the first and second ends 310, 320 and transversely from the first side 330 to a segment junction 370. The wall 50 defines a second segment 360 extending longitudinally between the first and second ends 310, 330 and transversely from the second side 340 to the segment junction 370.

The first segment 350 has a first coefficient of thermal expansion (CTE) and the second segment 360 has a second CTE that differs from the first CTE, to define a transverse CTE gradient. The second CTE may be lower than the first CTE. As a result, when subject to thermal energy, the controlled elastic deformation may be obtained. FIG. 2B shows one type of deformation that may be obtained, which is an arcuate shape. Strategic control of the CTE gradient may result in the controlled expansion and contraction of the actuator 10.

The element 70 shown in FIGS. 2A and 2B may have a first length L1 (or longitudinal span) before being subjected to thermal energy. The element 70 may have a second length L2 after being subject to thermal energy, where the second length L2 is less than the first length L1. However, the outer surface 71 of the element 70 may have an arc length L2*x* that is longer than L1.

The first and second segments 350, 360 both may be formed of a first material having the first CTE. The first segment 350 may include first fibers 355 formed of a second material that differs from the first material and has the second CTE. In some embodiments, the second segment 360 may also include second fibers 365 formed of a third material that differs from the first and second materials and has a third CTE that differs from the first and second CTEs. The third CTE may be greater than the second CTE. That is, one side of the illustrated element 70 deforms less than the other when subject to heat, resulting in the arcuate shape (or other predetermined shape) shown in FIG. 2B.

Figure 3B:
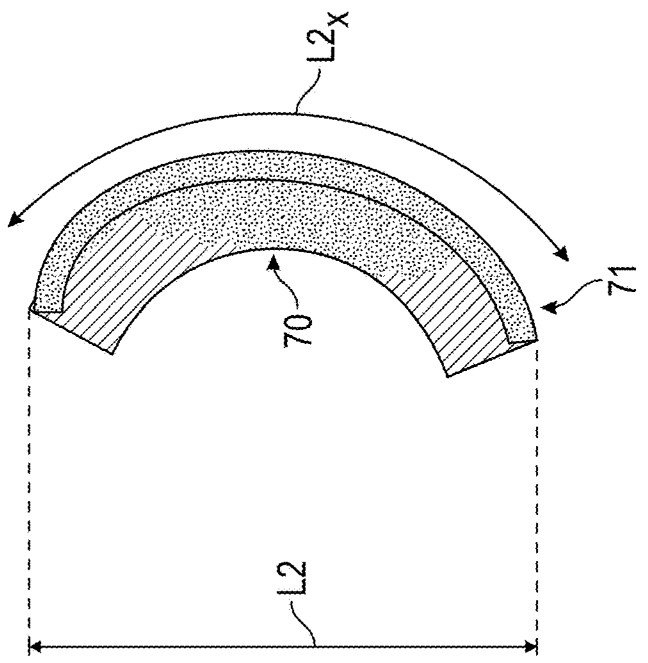
FIG. 3B shows the element of FIG. 3A in a deformed state.
Figure 3A:
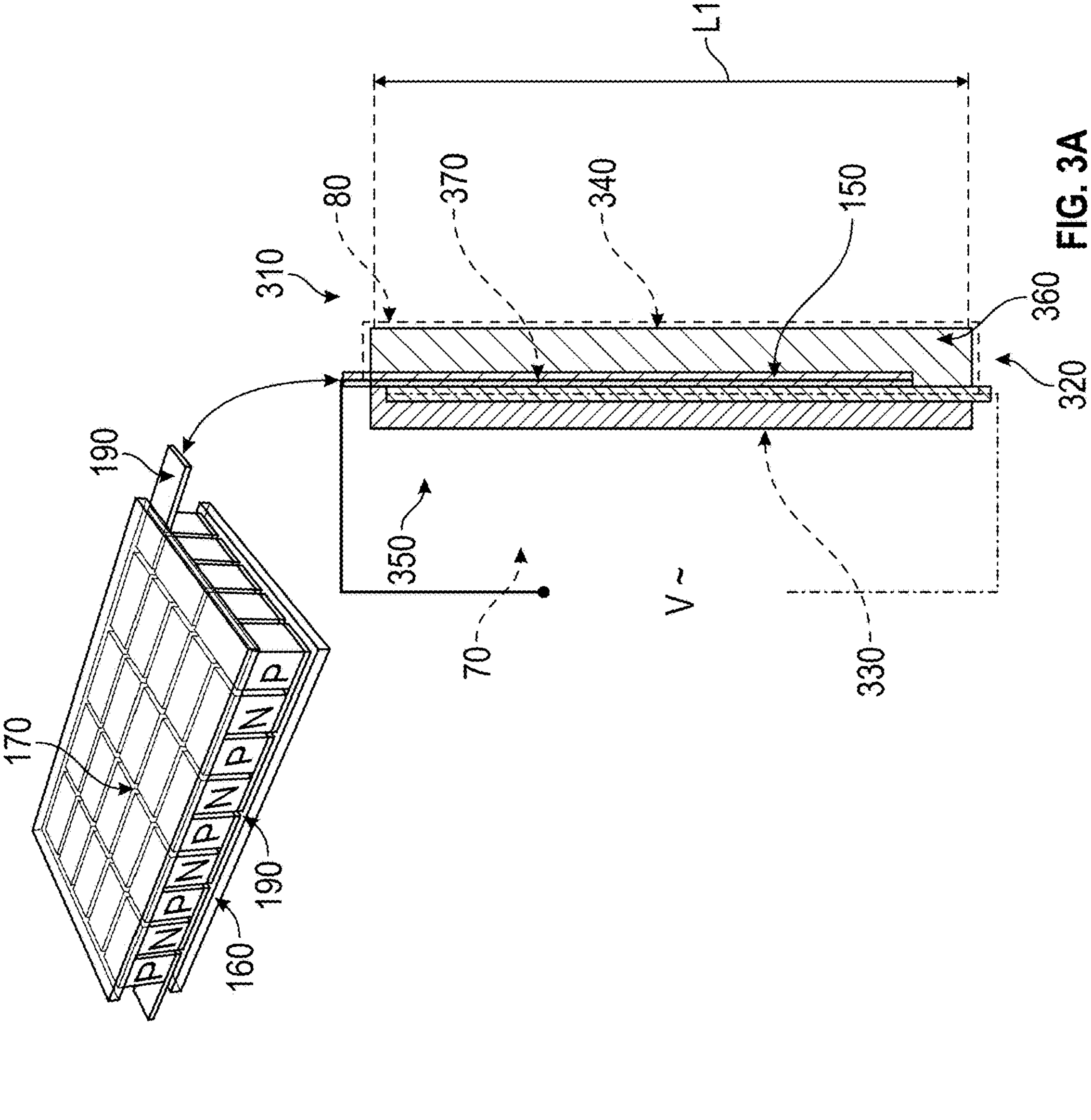
FIG. 3A shows an alternative element with different materials having different coefficients of thermal expansion (CTE) selected to provide a predetermined deformation, and with a thermal junction.

Turning to FIG. 3A, in one embodiment, which has the same outer shape and segment geometry as the embodiment of FIG. 2A, the first segment 350 is formed of a first material having the first CTE. The second segment 360 is formed of a second material that differs from the first material and has the second CTE. The first segment 350 may define a first CTE gradient and the second segment may define a second CTE gradient. A maximum difference between the first CTE and the second CTE is at the first and second sides 330, 340 and a minimum difference between the first CTE and the second CTE is at the segment junction 370. In one embodiment, at the segment junction 370, the first CTE and the second CTE are the same as each other. As shown in FIG. 3B, with this configuration, applying thermal energy to the element 70 results in a predetermined curvature, similar to that shown in FIG. 2B.

In the embodiment of FIG. 3A, the wall extends linearly between the first and second ends 310, 320. The element 70 shown in FIGS. 3A and 3B may have a first length L1 (or longitudinal span) before being subjected to thermal energy. The element 70 may have a second length L2 after being subject to thermal energy, where the second length L2 is less than the first length L1. However, the outer surface 71 of the element 70 may have an arc length L2*x* that is longer than L1.

Figure 4:
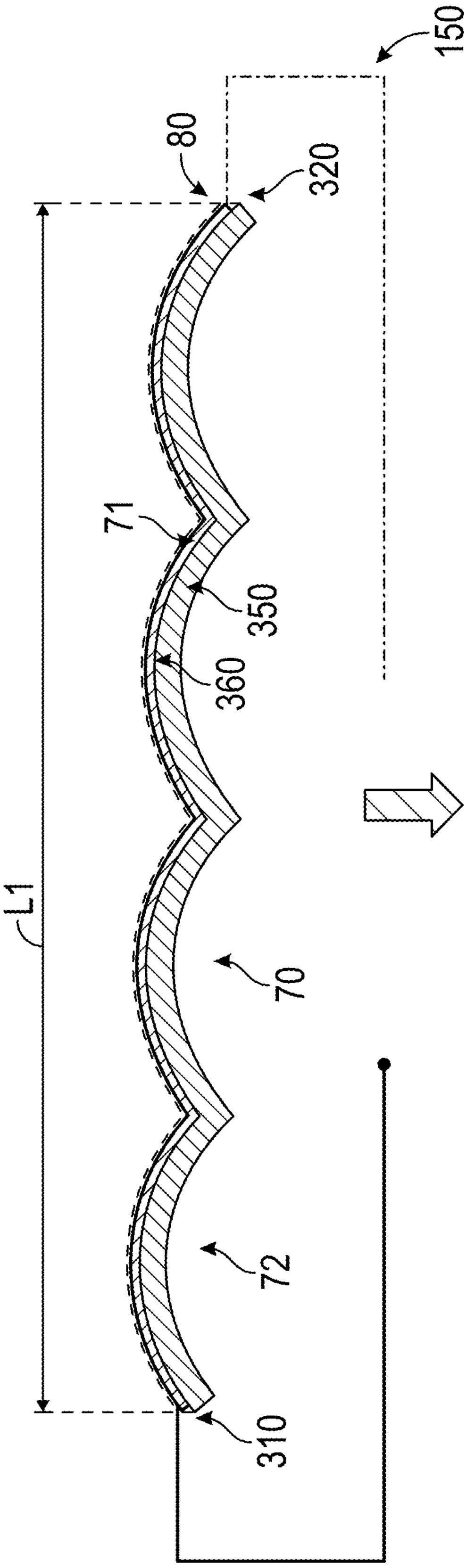
FIG. 4 shows an alternative element formed with arcs between opposite ends.
Figure 5:
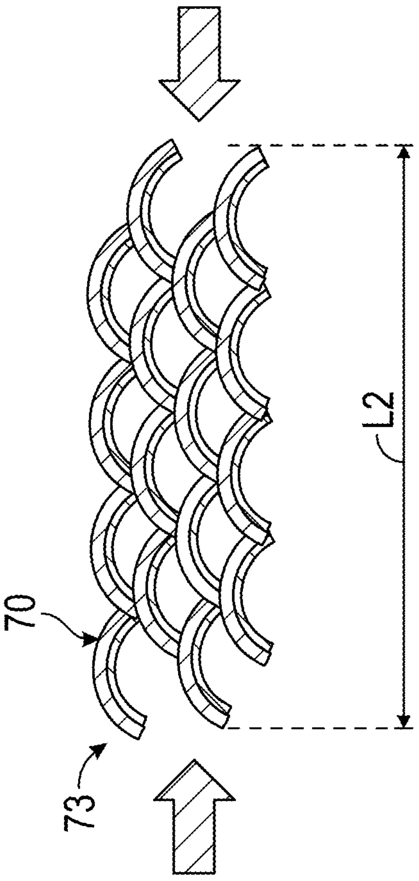
FIG. 5 shows a lattice having the element of FIG. 4, where the lattice is in a deformed state.

As shown in FIG. 4 the element 70 may define one or more arc segments 72 between the first and second ends 310, 320 rather than being liner as shown in FIGS. 2A and 2B. The element 70 includes the first and second segments 350, 360 with the junction 370 therebetween that extends between the ends 310, 320. FIG. 5 shows the predetermined deformation of a lattice 73 of such elements 70, stacked one on top of the other, when subject to thermal energy.

The element 70 shown in FIG. 4 may have a first length L1 (or longitudinal span) before being subjected to thermal energy. The element 70 as shown as the lattice 73 of FIG. 5 may have a second length L2 after being subject to thermal energy, where the second length L2 is less than the first length L1.

Turning back to FIG. 3A, a thermoelectric junction 150 is disposed around the outer boundary 80, e.g., along the outer surface 71 of the second segment 360 and between opposite ends 310, 320 as a non-limiting example. The thermoelectric junction 150 otherwise may be between the first and second segments 350, 360, i.e. at the segment junction 370. This may enable selectively adding thermal energy to the element 70 (FIG. 3B) to obtain the predetermined deformation, such as the actuation of the actuator 10.

The thermoelectric junction 150 may form a Peltier or a Thomson device. For example, alternating P and N-type pillars made with materials with different Seebeck coefficients, or legs, are placed thermally in parallel to each other and electrically in series and joined with a thermally conducting plate on each side, e.g., ceramic, including a cooling plate 160 and a heating plate 170. When a voltage is applied to the free ends of the two semiconductors, via connections 190 there is a flow of DC current across the junction of the semiconductors, causing a temperature difference. The side with the cooling plate 160 absorbs heat which is then transported by the semiconductor to the other side of the device. One of the cooling plate 160 or heating plate 170 may be exposed to the atmosphere if desired to bleed energy from it rather than directing energy from it back to the component 10.

Similarly, the thermoelectric junction 150 is shown in FIG. 4 along the outer boundary 80, e.g., along the outer surface 71 of the second segment 360 and between opposite ends 310, 320 as a non-limiting example. The thermoelectric junction 150 otherwise may be between the first and second segments 350, 360, i.e., at the segment junction 370. This may enable selectively adding thermal energy to the lattice 73 (FIG. 5) to obtain the predetermined deformation, such as the actuation of the actuator 10.

Figure 6:
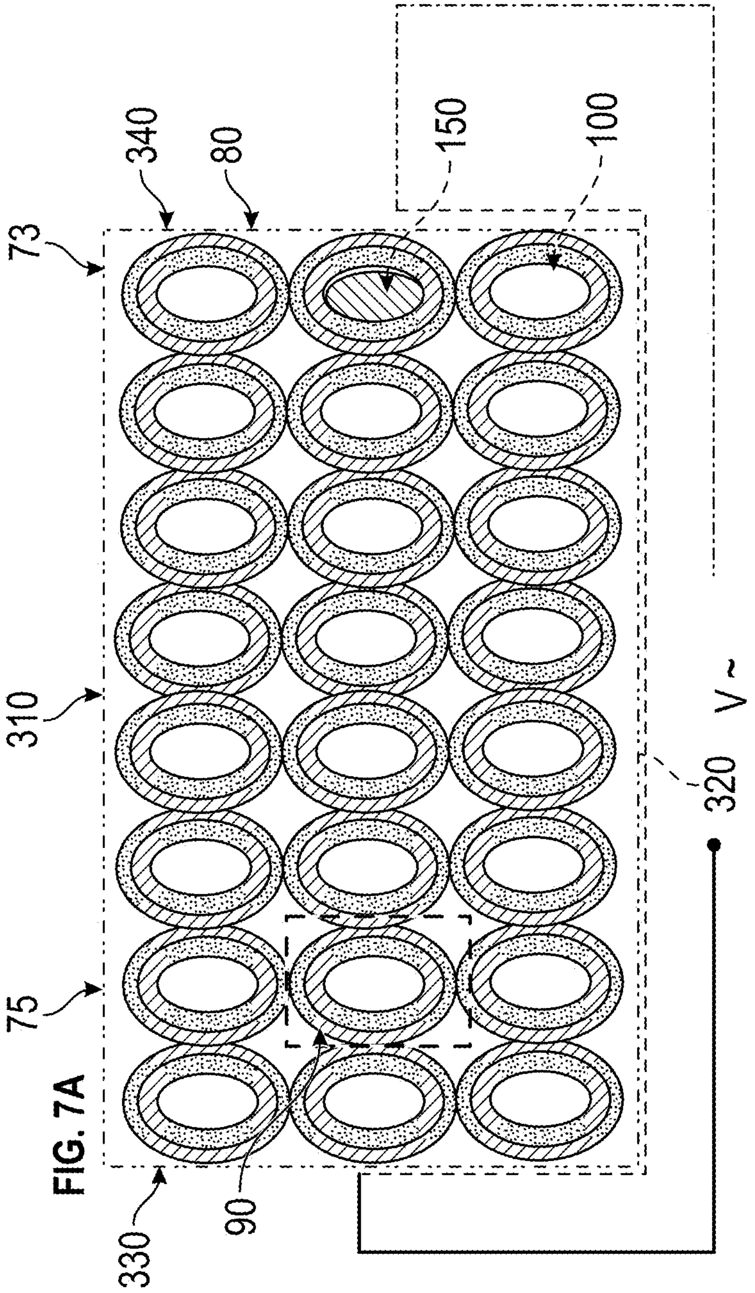
FIG. 6 a base with beads that may be utilized for the body of the component, and which includes a thermal junction within the beads or round an outer boundary of the base.

Turning to FIG. 6, the actuator 10 may define a base 75 having an outer boundary 80 extending longitudinally from a first end 310 to a second end 320 and transversely from a first side 330 to a second side 340. Beads 90 (each corresponding to an element 70 in the above embodiments) may be disposed within the outer boundary 80 and arranged as a lattice 73. Each of the beads 90 may be nonmetal, and may be, e.g., a thermoplastic.

Figure 7A:
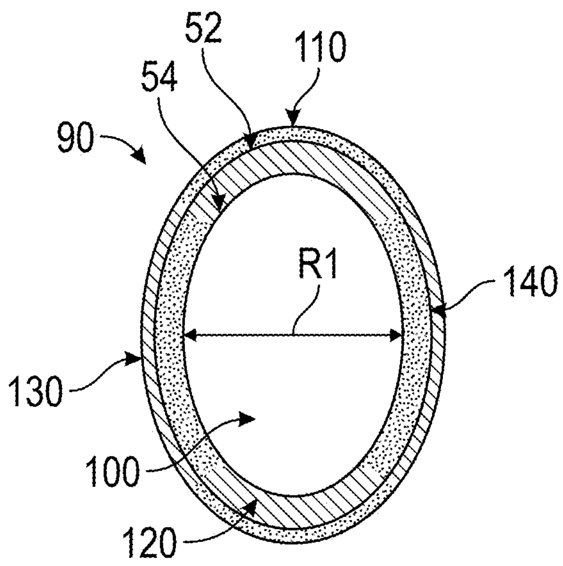
FIG. 7A shows details of one of the beads.

As shown in FIG. 7A, each of the beads 90 may have a bead void 100, e.g., in its center to form a closed loop. Each of the beads 90 may define first and second perimeter segments 110, 120 that are opposite each other and have a first CTE. Third and fourth perimeter segments 130, 140 may be opposite each other and adjacent to the first and second perimeter segments 110, 120. The third and fourth perimeter segments 130, 140 may have a second CTE that differs from the first CTE, to define a bead CTE gradient.

In some embodiments, each of the beads 90 may have an outer surface 52 and an inner surface 54. The inner surface 54 defines the bead void 100. The outer surface 52 of the first and second perimeter segments 110, 120 may have the first CTE. The inner surface 54 of the first and second perimeter segments 110, 120 may have the second CTE. The outer surface 52 of the third and fourth perimeter segments 130, 140 may have the second CTE. The inner surface 54 of the third and fourth perimeter segments 130, 140 may have the first CTE. Thus each segment of the beads 90 may form a segment CTE gradient that is the opposite the adjacent CTE gradient and the same as the opposite bead segment.

Figure 7B:
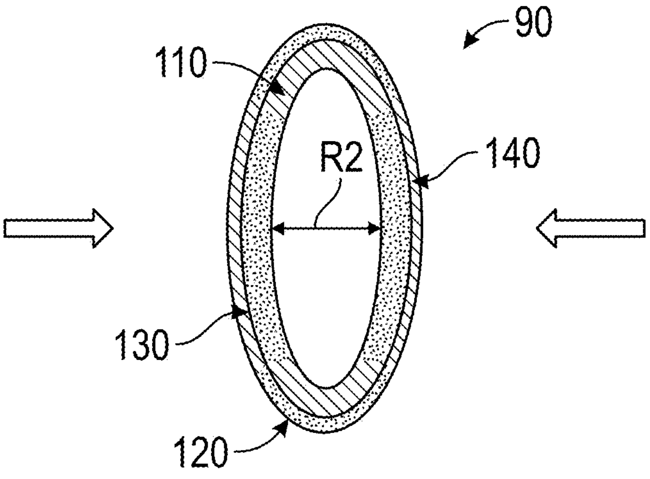
FIG. 7B shows the bead of FIG. 7A in a deformed state.

As shown in FIG. 7B, the bead 90 may deform to a predetermined shape when subject to thermal energy. For example, the bead 90 may deform from an oval with a first radius R1 along its short axis to an oval with a second radius R2 along the short axis that is smaller than the first radius R1.

Figure 8B:
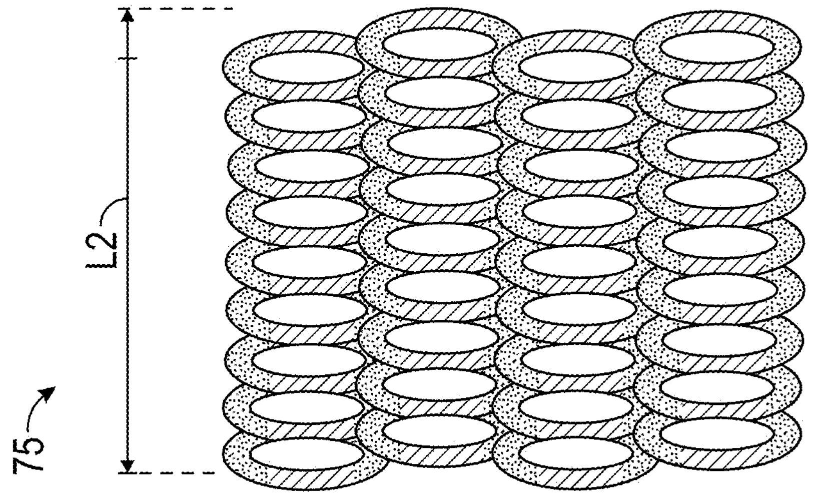
FIG. 8B shows the lattice of FIG. 8A in a deformed state.
Figure 8A:
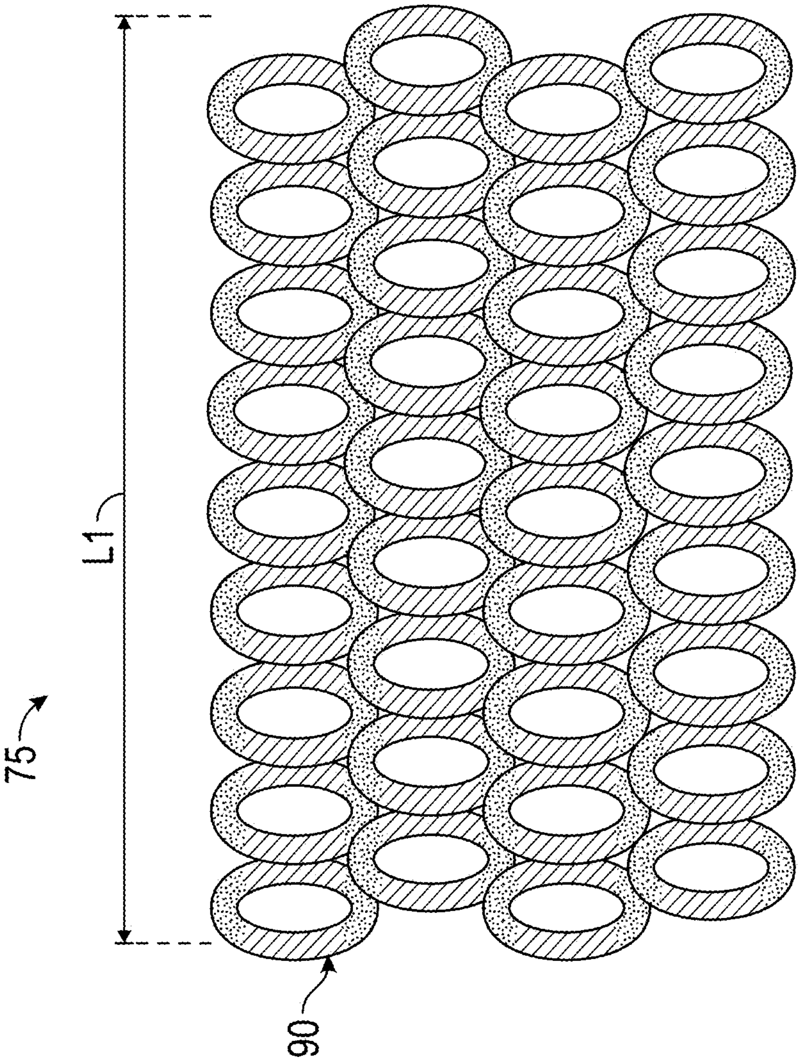
FIG. 8A shows the lattice of FIG. 5 without the thermal junction, for simplicity.

As shown in FIG. 8A, the lattice 73 of beads 90 may have a first length L1 (or longitudinal span) before being subjected to thermal energy. As shown in FIG. 8B, the lattice 73 may have a second length L2 after being subjected to thermal energy, where the second length L2 is less than the first length L1.

Turning back to FIG. 6, a thermoelectric junction 150 may be disposed around the outer boundary 80, as illustrated around the second end 320 and portions of the first and second sides 330, 340, as non-limiting embodiments, or in one or more of the bead voids 100. This may enable selectively adding thermal energy to the lattice 73 to obtain the predetermined deformation, such as the actuation of the actuator 10.

Figure 9:
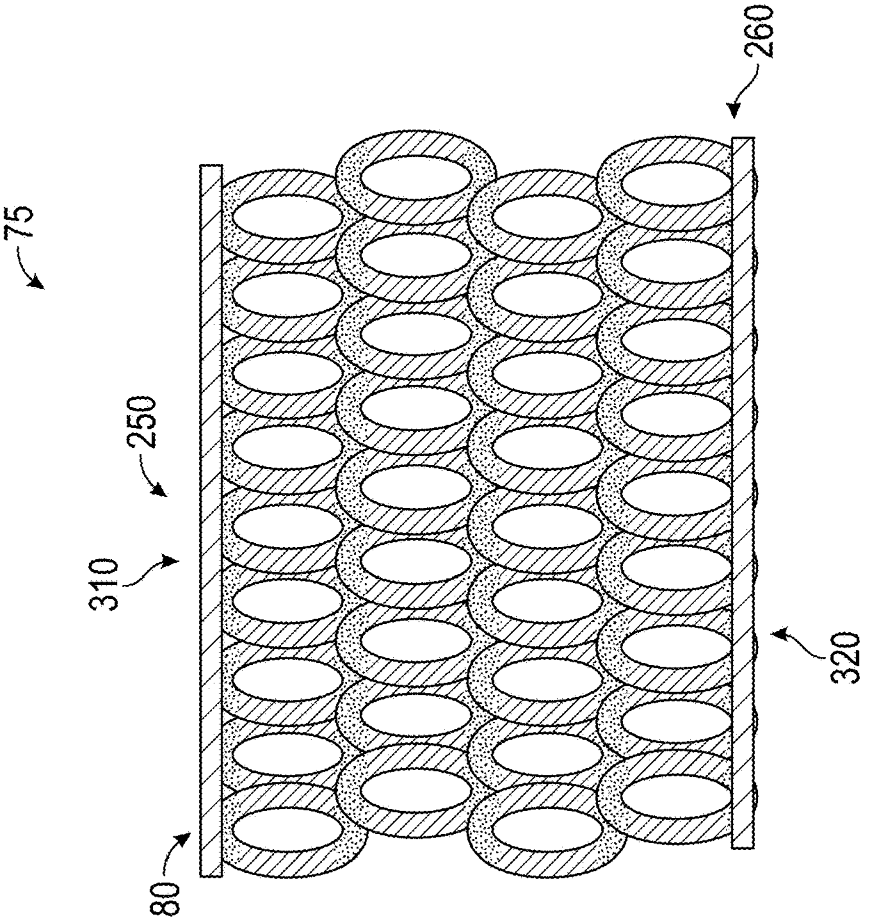
FIG. 9 shows the lattice of FIG. 8A with top and bottom elastomer layers.

Turning to FIG. 9, the first and second ends 310, 320, along the outer boundary 80 of the base 75 may include a top elastomer layer 250 and a bottom elastomer layer 260. These layers may be utilized for enclosing the beads 90 that are subject to engagement with the top and bottom supports 12, 14 (FIG. 1B) of the actuator 10.

Figure 10:
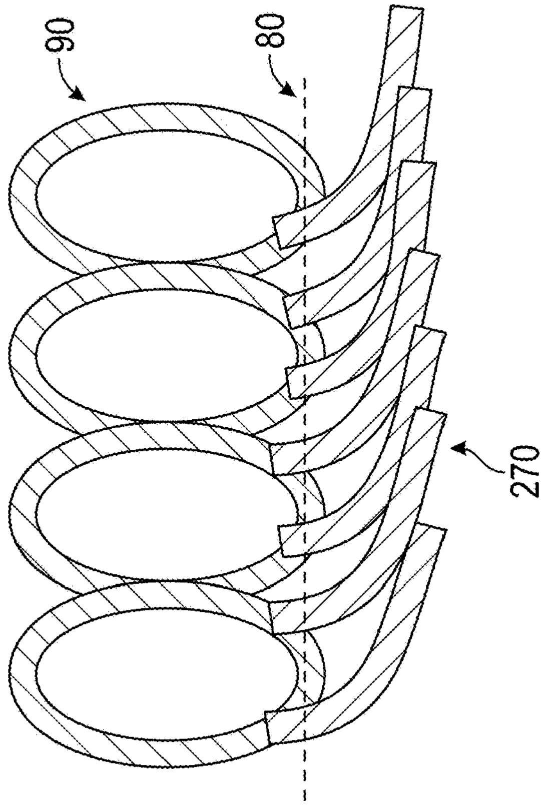
FIG. 10 shows several of the beads at the bottom boundary of the lattice of FIG. 8A, with elastic elements extending from each of the beads.

Turning to FIG. 10, the base 75 may include an elastomer segment 270 that extends from each of the beads 90 that are located along the outer boundary 80. As a result, adjacent ones of the elastomer segments 270 may overlap each other to define a flexible outer boundary cover.

Figure 11B:
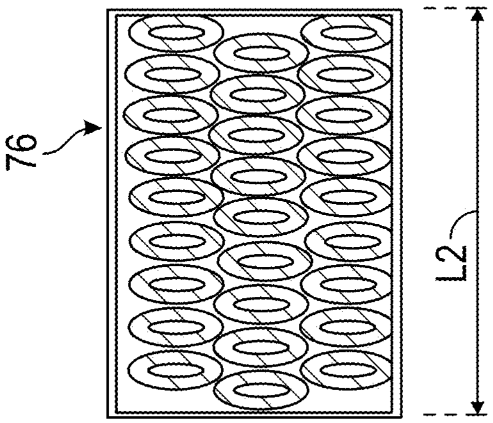
FIG. 11B shows the block of FIG. 11A in a deformed state.
Figure 11A:
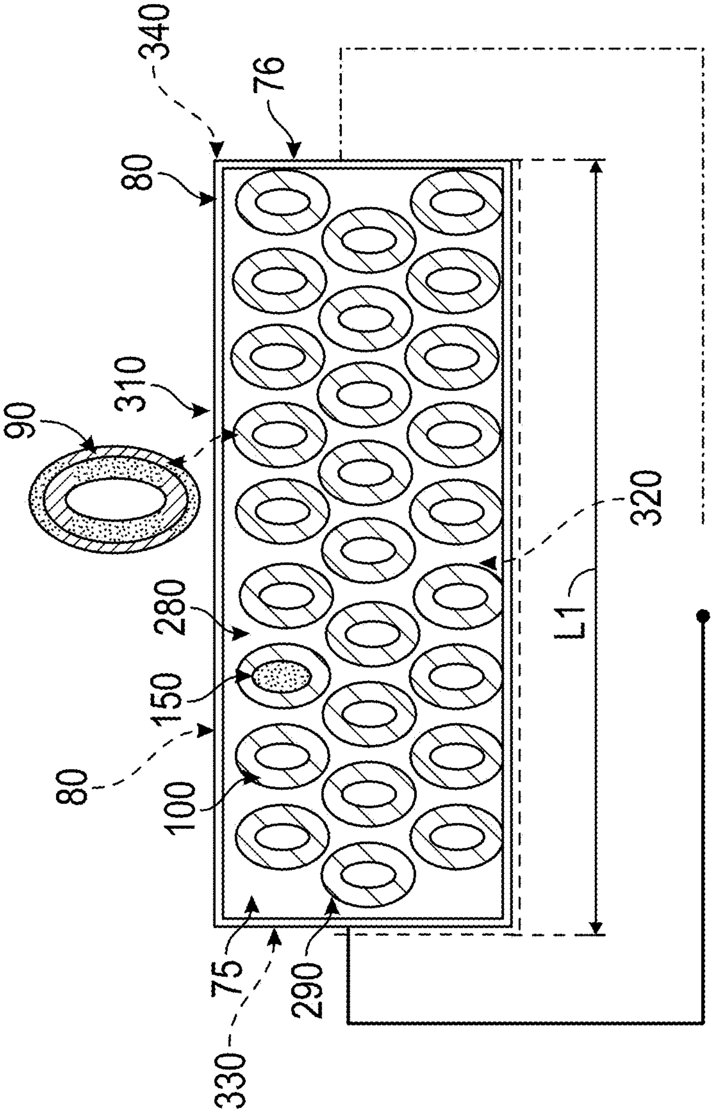
FIG. 11A shows the element as a block with voids having the beads.

Turning to FIG. 11A, the base 75 may be formed as a block 76 having an outer surface 77 defining the outer boundary 80 having the geometry identified in FIG. 6, including the first and second ends 310, 320 and the first and second sides 330, 340. The block 76 may define base voids 290. Each of the base voids 290 may be lined with one of the beads 90. The block 76 may be nonmetal, and may be, e.g., a thermoplastic.

The thermoelectric junction 150 may be disposed around the outer boundary 80 of the block 76, as illustrated around the second end 320 and portions of the first and second sides 330, 340, as non-limiting embodiments, or in one or more of the bead voids 100.

As shown in FIG. 11A, a block 76 containing the beads 90 may have a first length L1 (or longitudinal span) before being subjected to thermal energy. As shown in FIG. 11B, the block 76 may have a second length L2 after being subjected to thermal energy, where the second length L2 is less than the first length L1.

Figures 12A, 12B, 13A, 13B, 14A, 14B:
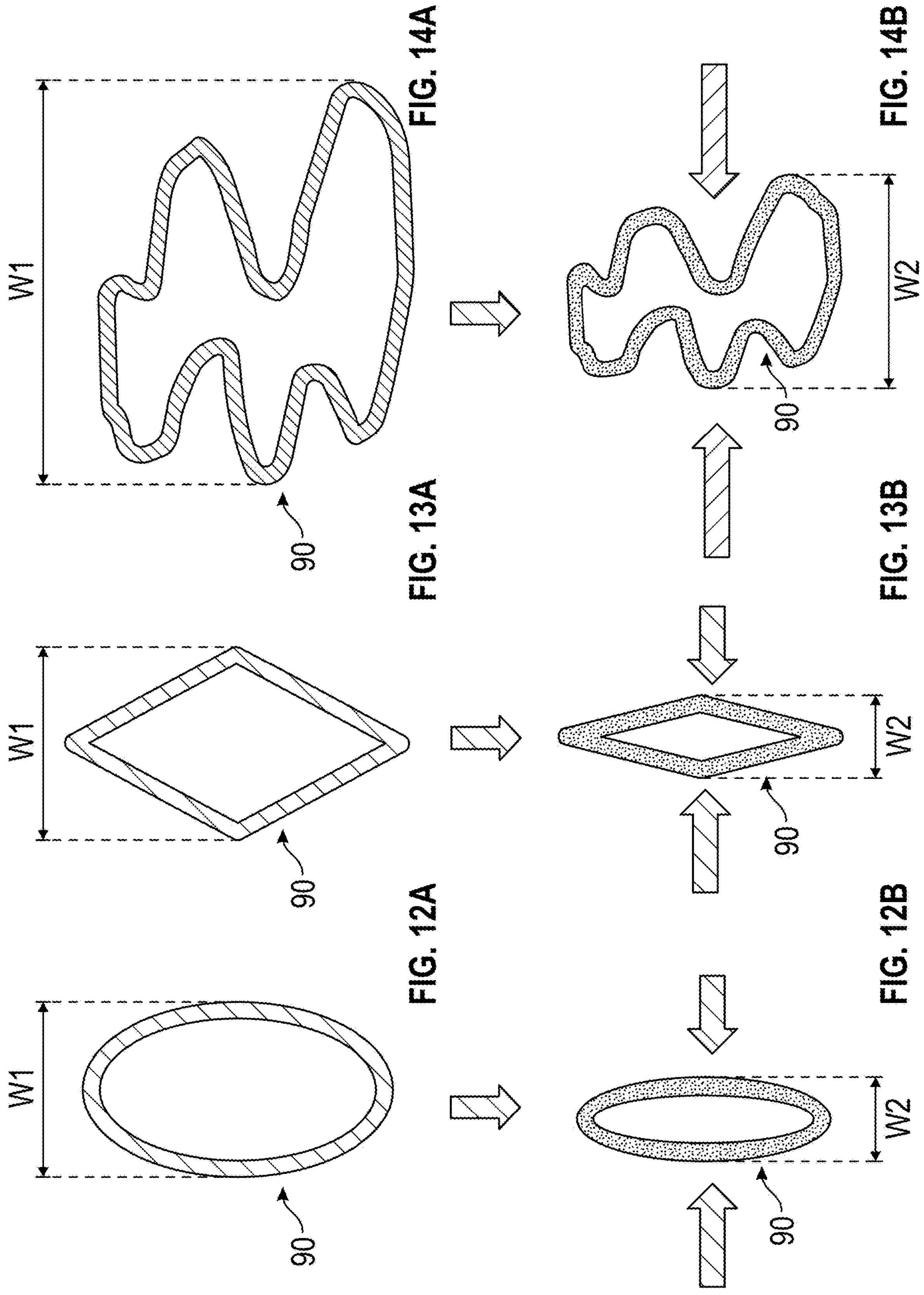
FIG. 12A shows an oval shaped bead, that can be utilized in disclosed embodiments utilizing beads, in a normal state.
FIG. 12B shows the bead of FIG. 12A in a deformed state.
FIG. 13A shows a diamond shaped bead, that can be utilized in disclosed embodiments utilizing beads, in a normal state.
FIG. 13B shows the bead of FIG. 13A in a deformed state.
FIG. 14A shows a random shaped bead, that can be utilized in disclosed embodiments utilizing beads, in a normal state.
FIG. 14B shows the bead of FIG. 14A in a deformed state.

FIG. 12A shows an oval shaped bead 90, which may be formed as indicated above, in a normal state having a first width W1. FIG. 12B shows the oval bead 90 in a deformed state having a second width W2 that is less than the first width W1. As indicated, the beads 90 do not need to be arcuate in shape. FIG. 13A shows a diamond shaped bead 90 in a normal state having a first width W1. FIG. 13B shows the diamond shaped bead 90 in a deformed state having a second width W2 that is less than the first width W1. FIG. 14A shows a random shaped bead 90 in a normal state having a first width W1. FIG. 14B shows the random shaped bead 90 in a deformed state having a second width W2 that is less than the first width W1. The desired deformation shape may determine the shape of the bead 90.

Figure 15A:
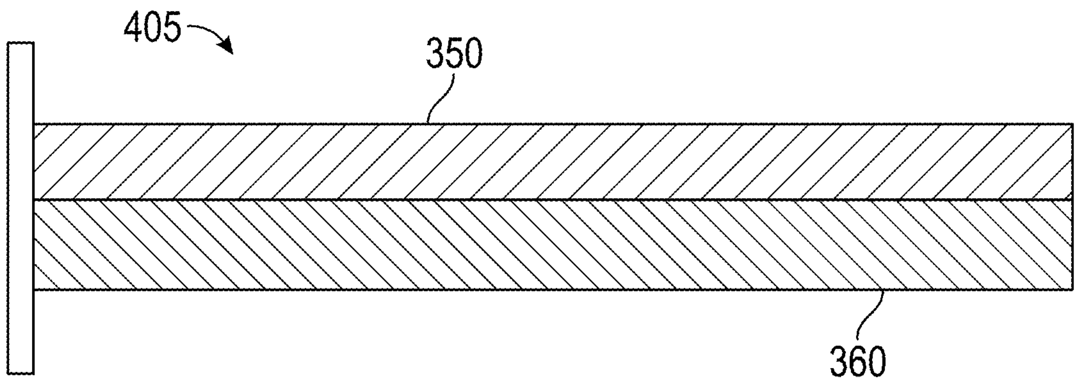
FIG. 15A shows an equivalent structure the structures shown above and for example in FIGS. 2-4.
Figure 15B:
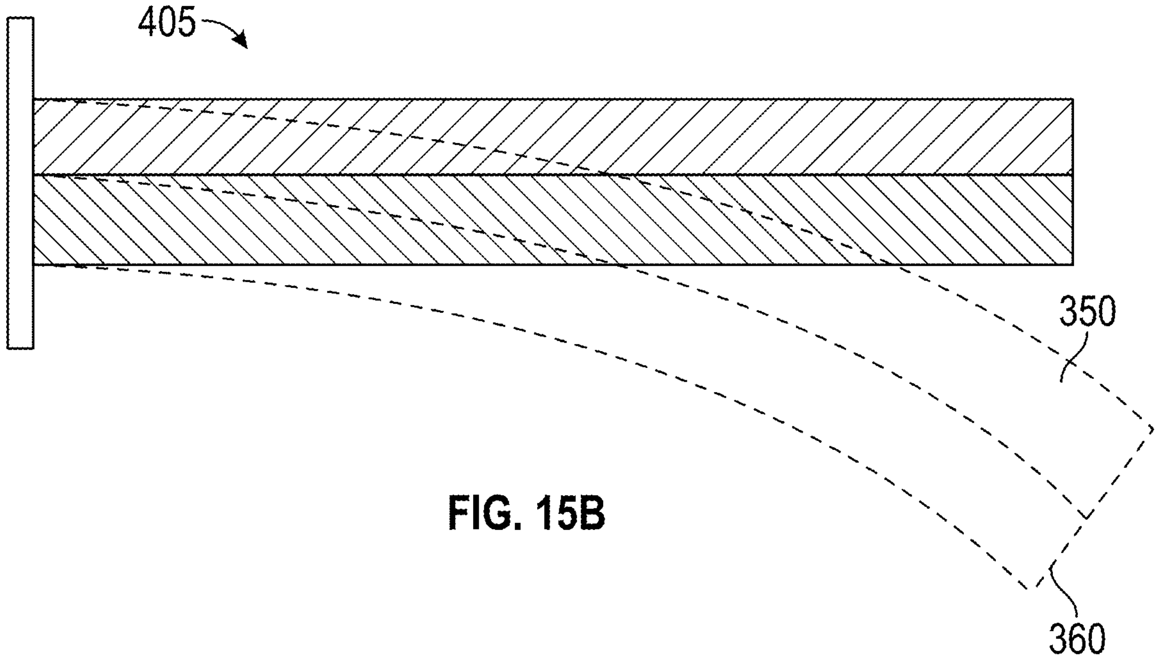
FIG. 15B shows the structure of FIG. 15A at a temperature T2>T1 and in a deformed state.

FIGS. 15A and 15B show an equivalent structure 405 to the structures shown above and for example in FIGS. 2-4. Specifically, the first and second segment 350, 360 are at a temperature T1 in FIG. 15A, and T2 that is greater than T1 in FIG. 15B, i.e., they have received thermal input. The controlled thermal expansion shown in FIG. 15B results from the segments being integrally connected. That is, the first and second segments 350, 360 bend together in a predictable and controlled way. That is, the controlled thermal expansion of the first and second segments 350, 360 in the disclose embodiments provides for controlled manipulation of the component disclosed herein.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, subcombinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An actuator, comprising:

an actuator body extending between an actuator top and an actuator bottom, a top actuator support located at the actuator top and a bottom actuator support located at the actuator bottom, wherein the actuator body includes:

a wall defining an outer boundary and extending longitudinally from a first end to a second end and transversely from a first side to a second side, wherein:

the wall is nonmetal;

the wall defines:

a first segment extending longitudinally between the first and second ends and transversely from the first side to a segment junction; and a second segment extending longitudinally between the first and second ends and transversely from the second side to the segment junction, wherein the first and second segments are formed of thermoplastic;

a thermoelectric junction is disposed around the outer boundary or between the first and second segments; and wherein:

the first segment is formed of a first material having a first coefficient of thermal expansion (CTE);

the second segment is formed of a second material having a second CTE that differs from the first CTE;

first fibers having the second CTE are embedded in the first segment; and second fibers, formed of a third material that differs from the first and second materials, and has a third CTE that differs from the first and second CTE, are embedded in the second segment, whereby the wall defines a transverse CTE gradient.

2. The actuator of claim 1, wherein the second CTE is lower than the first CTE.

3. The actuator of claim 1, wherein the third CTE is greater than the second CTE.

4. The actuator of claim 1, wherein:

the first segment defines a first CTE gradient, corresponding to one segment of the transverse CTE gradient, and the second segment defines a second CTE gradient, corresponding to another segment of the transverse CTE gradient, such that a maximum difference between the first CTE gradient and the second CTE gradient is at the first and second sides and a minimum difference between the first CTE gradient and the second CTE gradient is at the segment junction.

5. The actuator of claim 4, wherein:

at the segment junction, the first CTE gradient and the second CTE gradient are the same as each other.

6. The actuator of claim 1, wherein:

the wall extends linearly between the first and second ends.

7. The actuator of claim 1, wherein:

the wall defines one or more arcs between the first and second ends.

8. An actuator, comprising:

an actuator body extending between an actuator top and an actuator bottom, a top actuator support located at the actuator top and a bottom actuator support located at the actuator bottom, wherein the actuator body includes:

a base having an outer boundary extending longitudinally from a first end to a second end and transversely from a first side to a second side; and beads within the outer boundary, wherein each of the beads is nonmetal, has a bead void, and defines:

first and second perimeter segments that are opposite each other and have a first CTE; and third and fourth perimeter segments that are opposite each other and adjacent to the first and second perimeter segments and have a second CTE that differs from the first CTE, to define a bead CTE gradient.

9. The actuator of claim 8, wherein:

a thermoelectric junction is disposed around the outer boundary or in one or more of the bead voids.

10. The actuator of claim 9, wherein:

each of the beads defines:

an outer surface; and an inner surface, wherein the inner surface defines the bead void, wherein:

the outer surface of the first and second perimeter segments has the first CTE, and the inner surface of the first and second perimeter segments has the second CTE; and the outer surface of the third and fourth perimeter segments has the second CTE, and the inner surface of the third and fourth perimeter segments has the first CTE.

11. The actuator of claim 9, wherein:

the base includes a top elastomer layer that is disposed against the first end along the outer boundary and a bottom elastomer layer that is disposed against the second end along the outer boundary.

12. The actuator of claim 9, wherein:

the base includes an elastomer segment that extends from each of the beads that are located along the outer boundary of the base, so that adjacent ones of the elastomer segments overlap each other to define a flexible outer boundary cover.

13. The actuator of claim 9, wherein:

the base is formed as a block having an outer surface that defines the outer boundary and base voids, wherein each of the base voids is lined with one of the beads.

14. The actuator of claim 13, wherein the block is nonmetal.

15. The actuator of claim 9, wherein each of the beads is oval shaped or diamond shaped.

* * * * *